(12) United States Patent
Srinivasa et al.

(10) Patent No.: US 7,750,737 B2
(45) Date of Patent: Jul. 6, 2010

(54) COMMON MODE STABILIZATION IN A FULLY DIFFERENTIAL AMPLIFIER

(75) Inventors: Raghu Srinivasa, Bangalore (IN); Visvesvaraya Appala Pentakota, Bangalore (IN); Abhaya Kumar, Bangalore (IN)

(73) Assignee: Texas Instruments Incorporated, Dallas, TX (US)

( * ) Notice: Subject to any disclaimer, the term of this patent is extended or adjusted under 35 U.S.C. 154(b) by 22 days.

(21) Appl. No.: 12/196,313

(22) Filed: Aug. 22, 2008

(65) Prior Publication Data

US 2009/0058527 A1 Mar. 5, 2009

Related U.S. Application Data

(60) Provisional application No. 60/970,122, filed on Sep. 5, 2007.

(51) Int. Cl.
*H03F 3/45* (2006.01)

(52) U.S. Cl. ...................... 330/259; 330/258

(58) Field of Classification Search ............ 330/258, 330/259, 260
See application file for complete search history.

(56) References Cited

U.S. PATENT DOCUMENTS 6,459,338 B1 * 10/2002 Acosta et al. ............... 330/259
7,129,782 B2 * 10/2006 Lebedev et al. ............. 330/258

* cited by examiner

*Primary Examiner*—Khanh V Nguyen
(74) *Attorney, Agent, or Firm*—John J. Patti; Wade J. Brady, III; Frederick J. Telecky, Jr.

(57) ABSTRACT

A fully differential amplifier circuit provided according to an aspect of the present invention contains a stabilization block to measure the common mode component at the output of an input stage, and to inject a current proportionate to the common mode component into each of a pair of paths forming the output of the input stage to stabilize a feedback loop formed by the input stage, an output stage and a common mode feedback block. In an embodiment, the stabilization block contains a buffer to receive the measured common mode component and to provide a buffered output. The injected current is generated based on the buffered output. Due to the presence of the buffer, the differential loop may not be affected by injection of the additional current, thereby avoiding any distortions in the output signal.

22 Claims, 4 Drawing Sheets

COMMON MODE STABILIZATION IN A FULLY DIFFERENTIAL AMPLIFIER

RELATED APPLICATION

The application claims the benefit of U.S. provisional application No. 60/970,122, entitled: "Technique for Common Mode Stabilization Without Affecting the Differential Loop in a Fully Differential Amplifier", filed on: Sep. 5, 2007, naming the same inventors as in the subject application, attorney docket number: TI-65306PS, and is incorporated in its entirety herewith.

BACKGROUND

1. Field of the Invention

The present invention relates generally to amplifiers, and more specifically to common mode stabilization in fully differential amplifiers.

2. Related Art

Differential amplifiers refer to components which receive an input signal on a pair of input terminals and provide an amplified output. A fully differential amplifier provides the amplified output in differential form across a pair of output terminals.

Fully differential amplifiers employ additional circuitry for common mode stabilization. As is well known, common mode stabilization entails ensuring that the common mode voltage on the pair of output terminals is maintained at a desired level, typically since the magnitude of common voltage can affect the operation of any subsequent components that operate based on the outputs provided by the fully differential amplifier.

SUMMARY

A fully differential amplifier circuit provided according to an aspect of the present invention contains a stabilization block to measure the common mode component at the output of an input stage, and to inject a current proportionate to the common mode component into each of a pair of paths forming the output of the input stage to stabilize a feedback loop formed by the input stage, an output stage and a common mode feedback block.

In an embodiment, the stabilization block contains a buffer to receive the measured common mode component and to provide a buffered output. The injected current is generated based on the buffered output. Due to the presence of the buffer, the differential loop may not be affected by injection of the additional current, thereby avoiding any distortions in the output signal.

Several aspects of the invention are described below with reference to examples for illustration. It should be understood that numerous specific details, relationships, and methods are set forth to provide a full understanding of the invention. One skilled in the relevant art, however, will readily recognize that the invention can be practiced without one or more of the specific details, or with other methods, etc. In other instances, well-known structures or operations are not shown in detail to avoid obscuring the features of the invention.

BRIEF DESCRIPTION OF THE DRAWINGS

The present invention will be described with reference to the following accompanying drawings, which are described briefly below.

In the drawings, like reference numbers generally indicate identical, functionally similar, and/or structurally similar elements. The drawing in which an element first appears is indicated by the leftmost digit(s) in the corresponding reference number.

DETAILED DESCRIPTION

1. Example Environment

Figure 1:
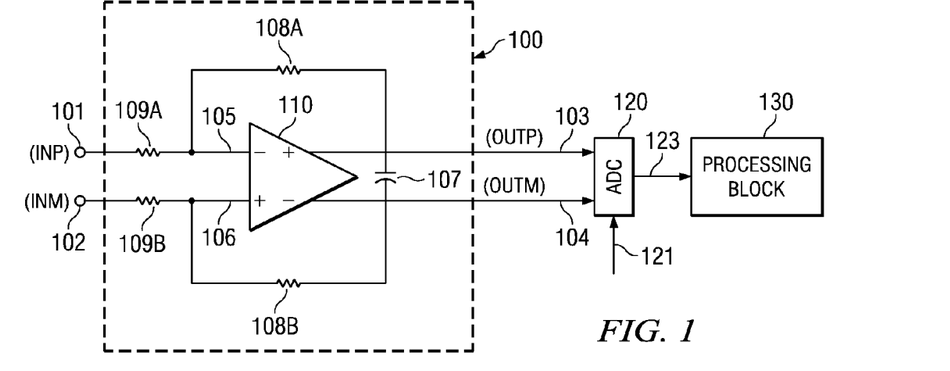
FIG. 1 is a block diagram illustrating an example environment in which several aspects of the present invention can be implemented.

FIG. 1 is a block diagram of an example environment in which several aspects of the present invention can be implemented. The diagram is shown containing fully differential amplifier 100, analog to digital converter (ADC) 120, and processing block 130. Fully differential amplifier 100 (referred to simply as amplifier 100 below) is shown containing operational amplifier (OPAMP) 110, and gain-setting resistor pairs 109A/108A and 109B/108B.

Amplifier 100 receives input signals on inputs terminals 101(INP) and 102 (INM) and provides a differential output across output terminals 103(OUTP) and 104(OUTM). Input signals received on terminals 101 and 102 may represent single-ended inputs (each input referenced to a ground or constant potential terminal, not shown), or a single differential signal across terminals 101 and 102. The inverting and non-inverting terminals of OPAMP 110 are respectively numbered 105 and 106. Gain-setting resistor pairs 109A/108A and 109B/108B have values designed to provide a desired gain to input 101/102. Capacitor 107, placed across the differential outputs 103/104 supplies transient current to a load circuit (ADC 120 in the example) connected to output terminals 103/104, thereby operating to minimize voltage variations of output voltage 103/104. IN the example environment of FIG. 1, amplifier 100 provides a differential reference voltage Vref across paths 103 and 104.

ADC 120 receives (gained) differential output 103/104 (Vref), and uses Vref in generating digital representations of an analog signal received on path 121 in a known way. ADC 120 forwards the generated digital representations (digital codes) on path 123 to processing block 130. Processing block 130 processes the digital codes received from ADC 120 to provide desired operations.

Although, in the example above, amplifier 100 is described as operating as a reference buffer (to provide a reference voltage Vref to ADC 120), in other environments amplifier 100 may be used as a general purpose amplifier to amplify signals. Similarly, in such alternative environments any type of active or passive load(s) may be connected to the differential outputs 103/104.

It is generally desirable that the differential output signal 103/104 have a substantially constant common mode component for proper operation of ADC 120. Various aspects of the present invention ensure such a constant common mode component. The aspects will be clearer in comparison with a prior approach not using at least some features of the present invention. Accordingly the description is continued with respect to a prior implementation of amplifier 100.

2. Prior Amplifier

Figure 2:
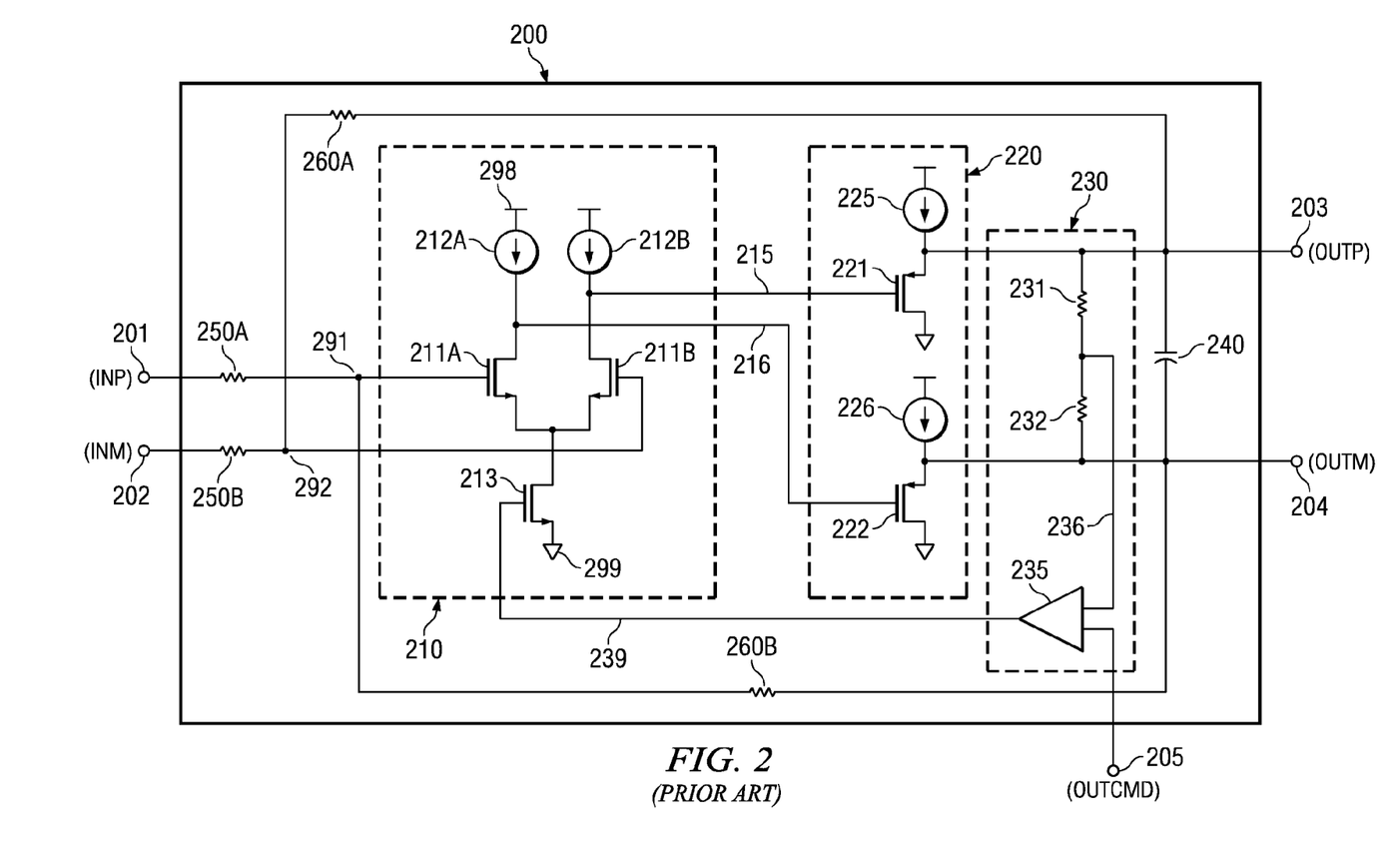
FIG. 2 is a circuit diagram illustrating a fully differential amplifier in a prior embodiment.

FIG. 2 is a circuit diagram illustrating the details of a prior implementation of a fully differential amplifier. Fully differential amplifier 200 is shown containing input stage 210, output stage 220 and common-mode feedback circuit 230. Power supply terminal 298 and ground terminal 299 are also shown.

Input stage 210 is shown implemented as a differential stage, and containing transistors 211A, 211B, current sources 212A and 212B, and constant current sink implemented by transistor 213. Input stage 210 receives input signals on input terminals 201 (INP) and 202 (INM) and provides differential outputs (across terminals/nodes 215 and 216) to output stage 220. The input (gate terminal) of transistor 213 is controlled by output 239 of error amplifier 235 of common-mode feedback circuit 230 (described below). Nodes 291 and 292 represent the inverting and non-inverting inputs of input stage 210.

Output stage 220 receives outputs 215/216 of input stage 210, and provides a buffered (with low output impedance) differential output across terminals 203 (OUTP) and 204 (OUTM). Output stage 220 is shown implemented as a pseudo-differential source follower, and containing transistors 221, 222, and current sources 225 and 226. As is well known in the relevant arts, differential output 203/204 is characterized by differential signal ((OUTP minus OUTM), representing the amplified difference of voltages at terminals INM and INP), and a common-mode voltage (OUTCM) (equal to the average of the voltage values at output terminals OUTP and OUTM). Resistors 250A, 250B, 260A and 260B determine the gain (differential gain) of amplifier 200, as is well known in the relevant arts.

Capacitor 240 operates similar to capacitor 107 of FIG. 1, and supplies transient current to a load connected to OUTP and OUTM. In addition, since the output (OUTP/OUTM) of amplifier 200 is differential in nature, the provision of "differential" capacitor 240 across OUTP and OUTM renders the differential output (OUTP/OUTM) substantially immune to possible unequal ground bounce, had capacitor 240 instead been implemented as two separate "single-ended" capacitors connected respectively between OUTP, OUTM to ground. Further, the use of capacitor 240 connected differentially is generally preferred over the use two single-ended capacitors (as noted above) to save significant area by reducing the total net capacitance required by a factor of four.

Common mode feedback circuit 230 is shown containing error amplifier 235, and a resistive divider with resistors 231 and 232. Resistive divider formed by resistors 231 and 232 provides on path 236, a voltage equal to the common mode voltage OUTCM at terminals OUTP and OUTM. As is well-known, the common mode components of OUTCM at respective terminals OUTP and OUTM are equal in phase and magnitude.

Error amplifier 235 receives as inputs the common mode voltage on path 236, and a desired (pre-determined) common-mode voltage (required to be maintained on terminals OUTP and OUTM) on path 205. Error amplifier 235 compares the common mode voltage OUTCM provided on path 236 and the desired output common-mode voltage OUTCMD (205), and provides a control voltage on path 239 to the gate terminal of transistor 213 to cause OUTCM to ideally equal OUTCMD. Error amplifier may provide a gain (Acm) to the difference of voltages OUTCM and OUTCMD. Thus, common mode feedback circuit 230 ideally operates to maintain the common mode voltage OUTCM at the desired value OUTCMD.

Figure 3:
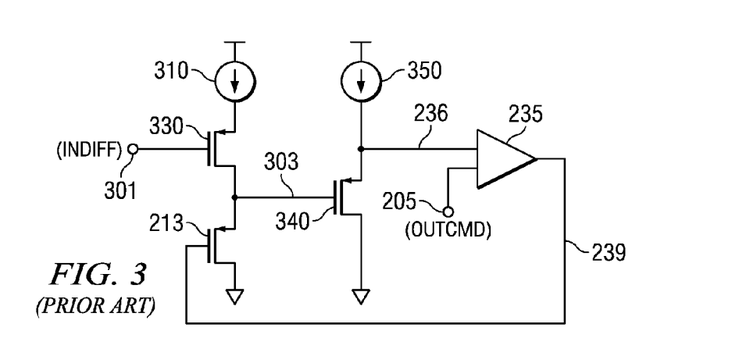
FIG. 3 is a circuit diagram illustrating the common mode loop in a fully differential amplifier in a prior embodiment.

FIG. 3 is a diagram representing the common-mode loop of the circuit of FIG. 2. In FIG. 3, transistor 330 represents the combination of transistors 211A and 211B receiving a differential input (denoted INDIFF, and representing the difference of the signals at nodes 291 and 292) at its gate terminal 301, while transistor 340 represents the combination of transistors 221 and 222. Current Source 310 represents the combination of current source 212A and 212B. Current Source 350 represents the combination of current sources 225 and 226. Error Amplifier 235 is shown receiving OUTCMD (205) and common mode voltage OUTCM (236).

Continuing with reference to FIG. 2, capacitor 240 serves to provide frequency compensation by providing dominant pole compensation to the differential loop formed by the following paths:

Node 291-path 216-OUTM (204)-resistor 260B-Node 291 and

Node 292-path 215-OUTP (203)-resistor 260A-Node 292.

As noted above, the differential connection of capacitor 240 has no effect on the common mode loop, and thus may not provide adequate frequency compensation to the common mode loop. As a result, the common mode loop may become unstable.

It is noted that the circuit of FIG. 3 may have three independent poles at nodes 303, 236 and 239, none of the three being significantly dominant relative to the other two. In general, such common mode instability issues may exist in any differential amplifier that has a frequency compensating component/network that is "seen" (effective in stabilizing) only by the differential loop. As a result of the issues noted above, the common mode voltage at OUTP and OUTM may either oscillate or cause the voltages at OUTP and OUTM to rise towards the power rails (298 and 299 in FIG. 2), which are not desirable.

One prior solution to stabilize the common mode loop is to provide passive components (e.g., capacitors) in a single-ended manner, for example, between each of terminals OUTP and OUTM to ground. However, such an approach may affect the stability and speed of response of the differential loop, potentially necessitating the use of more complex frequency compensation circuitry/network for the differential loop. Further, as noted above, the use of at least of single-ended capacitors may result in increased implementation area.

Several aspects of the present invention enable stabilization of a common mode loop in a fully differential amplifier without affecting a differential loop in the amplifier, as described next with respect to example embodiments.

3. Stabilizing a Common Mode Loop Without Affecting a Differential Loop

Figure 4:
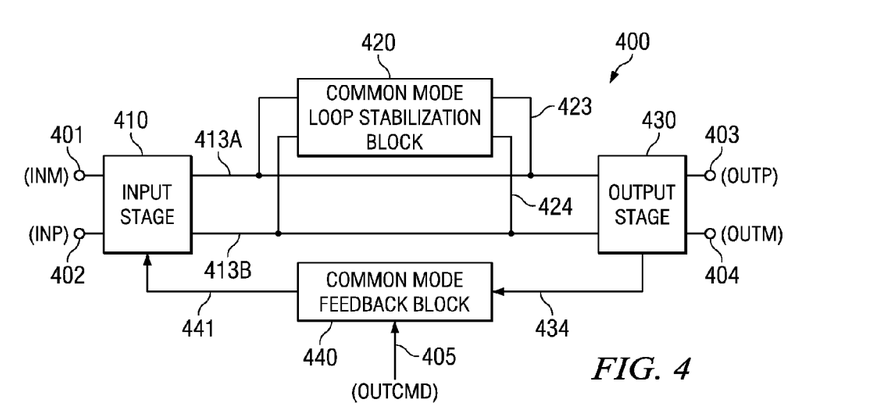
FIG. 4 is a block diagram of illustrating the details of a fully differential amplifier in an embodiment of the present invention.

FIG. 4 is a block diagram of a fully differential amplifier in an embodiment of the present invention. Fully differential amplifier 400 is shown containing input stage 410, common mode loop stabilization block 420, output stage 430 and common mode feedback block 440.

Input stage 410 receives input signals on terminals 401 (INM) and 402(INP) and provides an intermediate differential output across terminals 413A and 413B (also termed differential path 413A/413B for convenience). Input stage ideally amplifies the difference of the voltages across 401/402, while attenuating the common mode component of the input signal 401/402, as is well known in the relevant arts.

Input signals received on terminals 401 and 402 may represent single-ended inputs (each input referenced to a ground or constant potential terminal, not shown), or a single differential signal across terminals 401 and 402. Input stage 410 may be implemented as a differential stage, and provides high input resistance and a large gain to input 401/402.

Output stage 430 receives differential signal 413A/413B, and provides a buffered (low output impedance) differential output across terminals 403(OUTP) and 404(OUTM). Common mode feedback block 440 receives the common mode voltage on output terminals 403 and 404 (shown in FIG. 4 as being received via path 434) and the desired output common mode voltage OUTCMD 405, and operates to provide a desired common mode voltage (OUTCMD) on terminals 403 and 404. Common mode loop stabilization block 420 measures the common mode voltage on differential path 413A/413B (the common mode voltage on 413A/413B being representative to the common mode at output terminals 403/404), and injects a signal (conveniently termed common mode stabilization signal) proportionate to the common mode voltage on nodes 413A/413B via paths 423 and 424 into each of paths 413A and 413B.

In an embodiment described below, the provision of the common mode stabilization signal separately into each of paths 413A and 413B is designed to cause a dominant pole to be created at nodes 413A and 413B. As a result of the creation of the dominant pole, the common mode loop is stabilized. Further, the correction signal is generated and provided in a manner such as not to affect (the stability of) the differential loop of amplifier 400. The circuit details of amplifier 400 in such an embodiment are described next.

4. Embodiment

Figure 5:
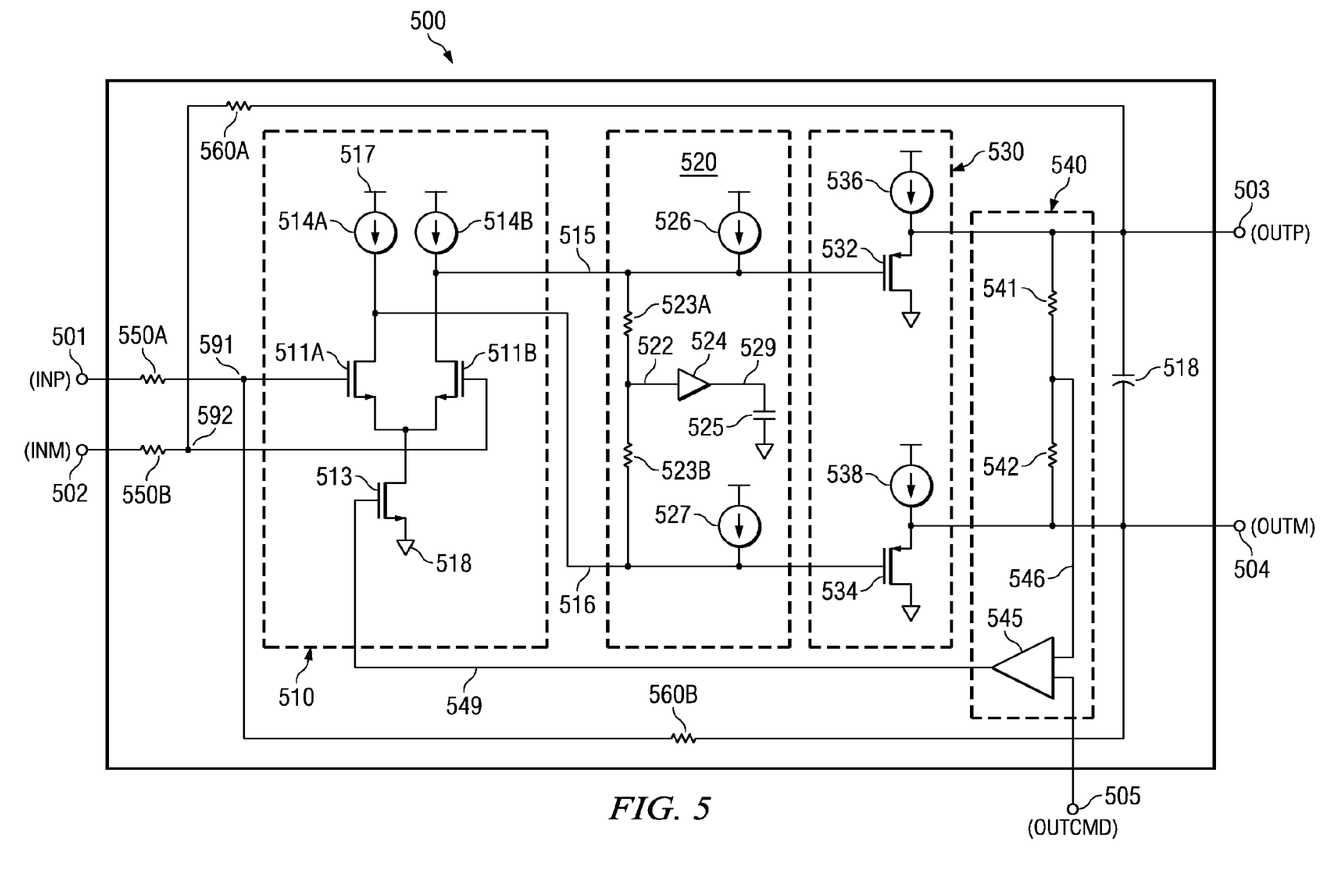
FIG. 5 is a circuit diagram illustrating the details of a fully differential amplifier in an embodiment of the present invention.

FIG. 5 is a circuit diagram illustrating the implementation details of a fully differential amplifier in an embodiment of the present invention. Fully differential amplifier 500 (conveniently referred to as amplifier 500) is shown containing input stage 510, output stage 530, common-mode feedback circuit 540 and common mode stabilization block 520. Terminals 517 and 518 correspond to power and ground respectively. Power and ground connections of other circuit elements in FIG. 5 (although not numbered) are connected appropriately as shown in the circuit diagram. The input signals to the fully differential amplifier are applied at terminals 501 and 502, and the differential output is measured across terminals 503 and 504. Resistor pairs 550A/560A, and 550B/560B set the (differential) gain of amplifier 500.

Input stage 510 operates similar to input stage 210 of FIG. 2, with current sources 514A and 514B, transistors 511A and 511B, and transistor 513 corresponding to current sources 212A and 212B, transistors 211A and 211B, and transistor 213 of FIG. 2, and therefore is not described here in the interest of conciseness. Similarly, output stage 530 operates similar to output stage 220 of FIG. 2, with transistors 532 and transistor 534 corresponding to transistors 221 and 222 respectively, and current sources 536 and 538 corresponding to current sources 225 and 226. Common mode feedback circuit 540 also operates similar to common mode feedback circuit 230 of FIG. 2, with error amplifier 545 corresponding to error amplifier 235, resistor divider network formed by resistors 541 and 542 corresponding to resistor divider network formed by resistors 231 and 232. Paths 549, 546 and 505 correspond respectively to paths 239, 236 and 205 respectively. Although shown to be implemented outside of output stage 530, capacitor 518 may also be implemented as part of the output stage.

Common mode stabilization block 520 is shown containing a resistor divider network containing resistors 523A and 523B, buffer 524, capacitor 525, and dependent current controlled current sources 526 and 527. The common mode voltage on paths 515 and 516 is provided at junction 522 of resistors 523A and 523B.

Buffer 524 provides a buffered common mode voltage output on node 529, thereby isolating the effect of capacitor 525 on nodes 515 and 516. In particular, the presence of buffer 524 avoids affecting the differential loop noted below.

The voltage on node 529 causes a current (Icap) proportional to common mode voltage 522 (Vcm) to flow through capacitor 525, with Icap as expressed by the following equation:

$$Icap = [A * Vcm/sC] \qquad \text{Equation 1}$$

wherein,

A is the gain of Buffer Amplifier,

Vcm is the common mode voltage as seen at node 522, sC is the Laplacian Transform of Capacitance C (Capacitor 525)

Each of dependent current controlled current sources 526 and 527 scales the capacitive current Icap, and adds a scaled current (K*Icap) to respective nodes 515 and 516. It is noted here that such scaling is done to reduce capacitor (525 in FIG. 5) implementation area. The effective common mode capacitance is (K times C), wherein C is the required capacitance of capacitor 525. Thus, for example, by using a value of K equal to 10, the capacitance (and hence implementation area) of capacitor 525 can be reduced by ⅒. Therefore, in an embodiment, the value of K equals 10. The resultant capacitive load on nodes 515 and 516 nodes results in a dominant pole on these nodes for the common mode loop, thereby stabilizing the common mode loop.

The (stability of) differential loop of amplifier 500 (which may be viewed as being formed by the two loops Node 591-path 516-OUTM (504)-resistor 560B-Node 591, and Node 592-path 515-OUTP (503)-resistor 560A-Node 592) is not affected by the added currents (K*Icap), since these currents are equal and in phase with respect to each other. The differential loop, therefore, remains stable, due to the dominant pole at the output (OUTP/OUTM) created by differentially connected capacitor 518 (similar to the effect of capacitor 240 noted above with respect to FIG. 2).

Figure 6:
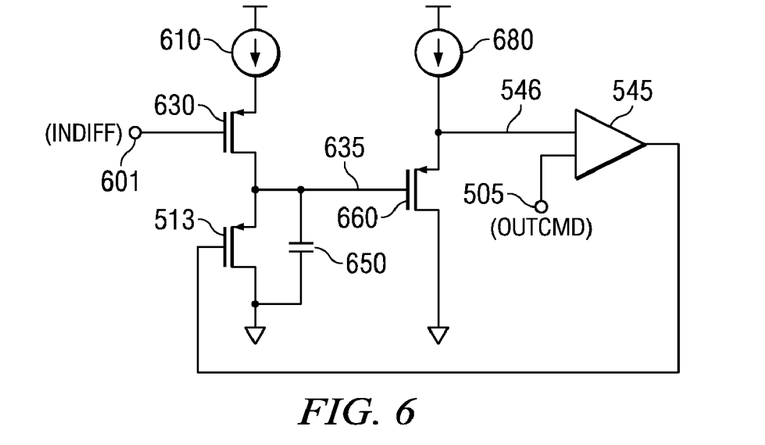
FIG. 6 is a circuit diagram illustrating the common mode loop in a fully differential amplifier in an embodiment of the present invention.

FIG. 6 illustrates the equivalent common-mode loop of the circuit of FIG. 5. In FIG. 6, transistor 630 represents the combination of transistors 511A and 511B receiving a differential input (denoted INDIFF, and representing the difference of the signals at nodes 591 and 592) at its gate terminal 601, while transistor 660 represents the combination of transistors 532 and 534. Current source 610 represents the combination of current source 514A and 514B. Current Source 680 represents the combination of current sources 536 and 538. The effect of the addition of currents by dependent current sources 526 and 527 (FIG. 5) is represented by "virtual" capacitive loading due to "virtual" capacitor 650. Thus, dominant pole compensation for the common mode loop is ensured by making this "virtual" capacitor "appear" at the node 635.

Figure 7:
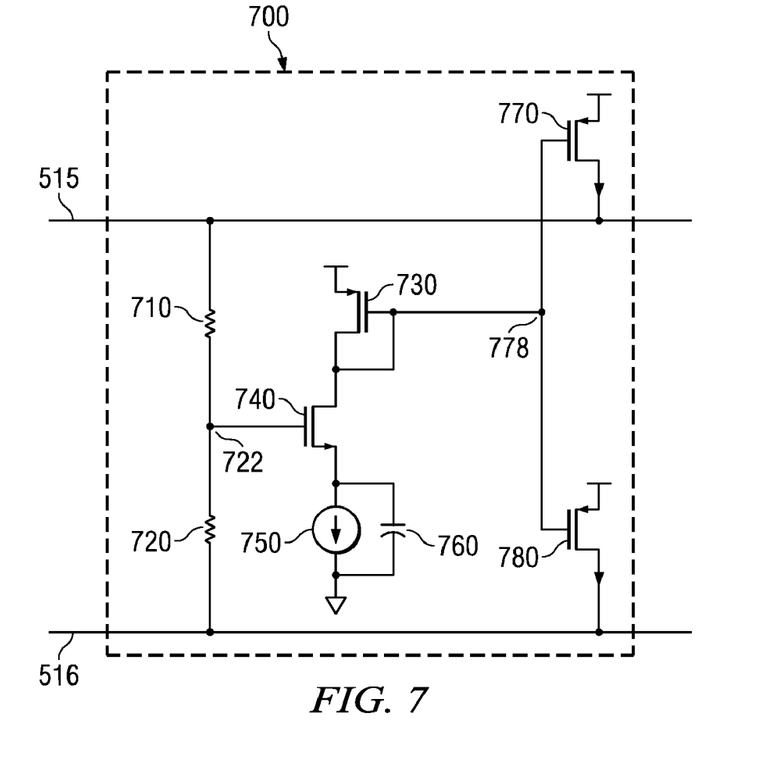
FIG. 7 is a circuit diagram illustrating the details of a stabilization circuit in an embodiment of the present invention.

FIG. 7 is a circuit diagram of an implementation of a common mode stabilization block in an embodiment of the present invention. Common mode stabilization block 700 is shown containing resistor divider network formed by resistors 710 and 720, transistors 730 and 740, current source 750, capacitor 760 and transistors 770 and 780. The gate and drain terminals of transistor 730 are shorted, and hence transistor 730 operates as a diode. Transistor 740 is configured to operate in a source follower configuration, and also serves to isolate node 722 (and thus paths 515 and 516) from any loading effect of capacitor 760. The gate terminals of transistors 770 and 780 are connected to the gate terminal (node 778) of transistor 730. Therefore transistors 770, 780 and 730 are connected in a current-mirror configuration.

The common mode voltage on paths 515 and 516 provided at junction 722 of resistors 710 and 720 is buffered by source follower 730. Capacitor 760 presents a capacitive load to the buffered common mode voltage provided by source follower 730. Since current through current source 750 cannot change, any change in the common mode voltage on paths 515 and 516 causes a capacitive current proportional to the change in common mode voltage to flow through diode-connected transistor 730, transistor 740 and capacitor 760. The capacitive current is mirrored by transistors 770 and 780 (due to the current-mirror configuration noted above). As a result, currents equal to the capacitive current noted above are injected in to the paths 515 and 516 by the current source pair 770 and 780. Sufficient current (hence bandwidth) in the diode (730) arm and careful matching of transistor pairs 770 and 780 ensures that the capacitive currents injected into paths 515 and 516 are equal and in-phase, and also have the desired phase to get sufficient common-mode capacitive loading (as will be apparent to one skilled in the relevant arts).

Thus, according to several aspects of the present invention, a common mode loop in a fully differential amplifier is stabilized without affecting a differential loop in the amplifier. An amplifier (e.g., amplifier 500) as described above may be used in place of amplifier 100 of FIG. 1 as well as in other environments) to provide several features according to the present invention.

Transistors 511A, 511B, and 513 (FIG. 5), and transistor 740 (FIG. 7) may be implemented as N-type MOS (metal oxide semiconductor transistors) while transistor 532 and 534 (FIG. 5), and transistors 730, 770, 780 may be implemented as P-type MOS (metal oxide semiconductor transistors). It should be appreciated that the specific type of transistors (NMOS, PMOS etc.) noted above are merely by way of illustration. However, alternative embodiments using different configurations and transistors will be apparent to one skilled in the relevant arts by reading the disclosure provided herein. For example, the NMOS transistors may be replaced with PMOS (P-type MOS) transistors, while also interchanging the connections to power and ground terminals.

Accordingly, in the instant application, the power and ground terminals are referred to as reference potentials, the source and drain terminals of transistors (though which a current path is provided when turned on and an open path is provided when turned off) are termed as current terminals, and the gate terminal is termed as a control terminal. Furthermore, though the terminals are shown with direct connections to various other terminals, it should be appreciated that additional components (as suited for the specific environment) may also be present in the path, and accordingly the connections may be viewed as being electrically coupled to the same connected terminals.

In addition, the circuit topologies of FIGS. 5 and 7 are merely representative. Various modifications, as suited for the specific environment, without departing from the scope and spirit of several aspects of the present invention, will be apparent to one skilled in the relevant arts by reading the disclosure provided herein.

While various embodiments of the present invention have been described above, it should be understood that they have been presented by way of example only, and not limitation. Thus, the breadth and scope of the present invention should not be limited by any of the above-described embodiments, but should be defined only in accordance with the following claims and their equivalents.

What is claimed is:

1. A fully differential amplifier circuit that receives an input signal and generates an amplified output signal in differential form, the circuit comprising:
   an input stage that receives the input signal and provides an intermediate signal in differential form on a pair of paths, wherein the intermediate signal having a differential component and a common mode component, and wherein the differential component is of a higher gain compared to the common mode component;
   an output stage that buffers the intermediate signal and provides the amplified output signal;
   a feedback block that provides a feedback signal to the input stage, wherein the feedback signal indicates a deviation of the common mode component in the amplified output signal from a desired level; and
   a stabilization block that measures the common mode component and injects a current that is proportional to the common mode component into each of the pair of paths to stabilize a feedback loop formed by the input stage, the output stage and the feedback block.

2. The circuit of claim 1, wherein the stabilization block comprises:
   a buffer that receives the measured common mode component and provides a buffered output; and
   a capacitor that passes a current that is proportional to the buffered output, wherein the injected currents are proportional to the current passed by the capacitor.

3. The circuit of claim 2, wherein the circuit further comprises a pair of current dependent current sources that generate the injected currents for each of the pair of paths.

4. The circuit of claim 3, wherein the currents injected into the pair of paths are equal in magnitude and of same phase.

5. The circuit of claim 4, wherein the buffer further comprises a transistor that is configured to operate as a source follower, and wherein the capacitor is coupled between a source terminal of the transistor and a constant reference potential.

6. The circuit of claim 5, wherein the stabilization block further comprises a current mirror circuit having the pair of current dependent current sources, wherein the current mirror circuit is coupled to mirror the current flowing through the capacitor such that each of the pair of current dependent current sources injects a current that is proportional to the current flowing through the capacitor.

7. The circuit of claim 6, wherein the stabilization block further comprises a pair of resistors having equal resistance, wherein the pair of resistors are coupled in series between the pair of paths, and wherein a node between the pair of resistors provides the common mode component to the buffer.

8. The circuit of claim 7, wherein the amplified output signal is provided across a pair of output terminals, and wherein the circuit further comprises:
- a first resistor coupled between a first input of the input stage and a first one of the pair of output terminals;
- a second resistor coupled between a second input of the input stage and another one of the pair of output terminals;
- a third resistor coupled between the first input and an input terminal of the fully differential amplifier circuit; and
- a fourth resistor coupled between the second input and another input terminal of the fully differential amplifier circuit.

9. A system comprising:
- an analog to digital converter (ADC);
- a processor that is coupled to the ADC; and
- a fully differential amplifier circuit that receives an input signal and generates a reference voltage for the ADC by amplifying the input signal, the fully differential amplifier circuit including:
    - an input stage that receives the input signal and provides an intermediate signal in differential form on a pair of paths, wherein the intermediate signal having a differential component and a common mode component, and wherein the differential component is of a higher gain compared to the common mode component;
    - an output stage that buffers the intermediate signal and provides the amplified output signal;
    - a feedback block that provides a feedback signal to the input stage, wherein the feedback signal indicates a deviation of the common mode component in the amplified output signal from a desired level; and
    - a stabilization block that measures the common mode component and injects a current that is proportional to the common mode component into each of the pair of paths to stabilize a feedback loop formed by the input stage, the output stage and the feedback block.

10. The system of claim 9, wherein the stabilization block comprises:
- a buffer that receives the measured common mode component and provides a buffered output; and
- a capacitor that passes a current that is proportional to the buffered output, wherein the injected currents are proportional to the current passed by the capacitor.

11. The system of claim 10, wherein the fully differential amplifier circuit further comprises a pair of current dependent current sources that generate the injected currents for each of the pair of paths.

12. The system of claim 11, wherein the currents injected into the pair of paths are equal in magnitude and of same phase.

13. The system of claim 12, wherein the buffer further comprises a transistor that is configured to operate as a source follower, and wherein the capacitor is coupled between a source terminal of the transistor and a constant reference potential.

14. The system of claim 13, wherein the stabilization block further comprises a current mirror circuit having the pair of current dependent current sources, wherein the current mirror circuit is coupled to mirror the current flowing through the capacitor such that each of the pair of current dependent current sources injects a current that is proportional to the current flowing through the capacitor.

15. The system of claim 14, wherein the stabilization block further comprises a pair of resistors having equal resistance, wherein the pair of resistors are coupled in series between the pair of paths, and wherein a node between the pair of resistors provides the common mode component to the buffer.

16. The system of claim 15, wherein the amplified output signal is provided across a pair of output terminals, and wherein the circuit further comprises:
- a first resistor coupled between a first input of the input stage and a first one of the pair of output terminals;
- a second resistor coupled between a second input of the input stage and another one of the pair of output terminals;
- a third resistor coupled between the first input and an input terminal of the fully differential amplifier circuit; and
- a fourth resistor coupled between the second input and another input terminal of the fully differential amplifier circuit.

17. A method of stabilizing a common mode loop containing an input stage, an output stage and a feedback stage in a fully differential amplifier, the method comprising:
- measuring a common mode voltage at the output of the input stage;
- buffering the measured common mode voltage; and
- injecting a current to each of a pair of paths forming the output of the input stage, wherein the current is generated based on the buffered measured voltage.

18. An apparatus comprising:
- an input stage having a first input terminal, a second input terminal, an first output terminal, and a second output terminal, wherein the input stage receives an input signal and outputs an intermediate signal;
- a stabilization circuit having:
    - an measuring circuit that is coupled to the first output terminal of the input stage and the second output terminal of the input stage, wherein the measuring circuit measures a common mode component of the intermediate signal;
    - a first current source that is coupled to the first output terminal of the input stage, wherein the first current source injects a first current into the first output terminal that is proportional to the common mode component;
    - a second current source that is coupled to the second output terminal of the input stage, wherein the second current source injects a second current into the second output terminal that is proportional to the common mode component;
- an output stage that is coupled to the first and second output terminals of the input stage;
- common-mode feedback circuit that is coupled to the output stage and to the input stage.

19. The apparatus of claim 18, wherein the measuring circuit further comprises:
- a resistor network that is coupled between the first and second output terminals of the input stage;
- a buffer that is coupled to the resistor network; and
- a capacitor that is coupled to the buffer.

20. The apparatus of claim 19, wherein the buffer further comprises:
- an NMOS transistor that is coupled to the resistor network at its gate; and
- a third current source that is coupled to the source of the NMOS transistor, wherein the capacitor is coupled in parallel to the third current source.

21. The apparatus of claim 20, wherein the first and second current sources further comprise a current mirror circuit that is coupled to the drain of the NMOS transistor and to the first and second output terminals of the input stage.

22. The apparatus of claim 21, wherein the current mirror circuit further comprises:

a first PMOS transistor coupled to the drain of the NMOS transistor, wherein the first PMOS transistor is diode-connected;

a second PMOS transistor that is coupled to the first output terminal of the input stage at its drain and to the gate of the first PMOS transistor at its gate; and a third PMOS transistor that is coupled to the second output terminal of the input stage at its drain and to the gate of the first PMOS transistor at its gate.

* * * * *